(12) United States Patent
Coker et al.

(10) Patent No.: US 7,000,167 B2
(45) Date of Patent: Feb. 14, 2006

(54) DECODING LOW DENSITY PARITY CHECK CODES

(75) Inventors: Jon Coker, Rochester, MN (US); Ajay Dholakia, Gattikon (CH); Evangelos S. Eleftheriou, Zuric (CH); Rick Galbraith, Rochester, MN (US); Thomas Mittelholzer, Zurich (CH); Sedat Oelcer, Au (CH)

(73) Assignee: International Business Machines Corporation, Armonk, NY (US)

( * ) Notice: Subject to any disclaimer, the term of this patent is extended or adjusted under 35 U.S.C. 154(b) by 561 days.

(21) Appl. No.: 10/044,624

(22) Filed: Jan. 8, 2002

(65) Prior Publication Data

US 2003/0074626 A1 Apr. 17, 2003

(30) Foreign Application Priority Data

Aug. 1, 2001 (CH) ................................. 01100445

(51) Int. Cl.
*H03M 13/00* (2006.01)
(52) U.S. Cl. ..................................................... 714/752
(58) Field of Classification Search ............... 714/746, 714/752, 786, 791–796, 758, 801; 375/262, 375/341
See application file for complete search history.

(56) References Cited

OTHER PUBLICATIONS

Kschischang et al., Factor graph the and sum-product algorithm, Feb. 2001, IEEE Trans. on Info. Theory vol. 47, No. 2, p. 498-519.*

Chung et al., Analysis of sum-product decoding of low density parity check codes usign a Gaussian approximation, Feb. 2001, IEEE Trans. on Info. THeory, vol. 47, No. 2, p. 657-670.*
Mao et al., Decoding low density parity check codes with probabilistic schedule, 2001, IEEE, p. 119-123.*

* cited by examiner

*Primary Examiner*—Shelly Chase

(74) *Attorney, Agent, or Firm*—Ron Feece; William Gill

(57) ABSTRACT

A method for decoding Low Density Parity Check (LDPC) codes comprises executing a sum product algorithm to recover a set of information bits from an LDPC code represented as a bipartite graph of symbol nodes and check nodes, the sum product algorithm being responsive to input log likelihood ratios associated with the symbol nodes. The check nodes are updated by generating a set of forward difference metrics and a set of backward difference metrics in dependence on the ratios of logarithmic probabilities each associated with a corresponding symbol node of the LDPC code, updating each metric in the set of forward difference metrics in dependence on the absolute value of the log likelihood ratio associated with the symbol node and the absolute value of the previous metric in the set, updating each metric in the set of backward difference metrics in dependence on the absolute value of the log likelihood ratio associated with the symbol node and the absolute value of the previous metric in the set, and generating log likelihood ratios to be propagated back to each symbol node in dependence on the updated sets of forward and backward difference metrics.

9 Claims, 4 Drawing Sheets

DECODING LOW DENSITY PARITY CHECK CODES

FIELD OF THE INVENTION

The present invention relates to a method and apparatus for decoding Low Density Parity Check (LDPC) codes.

BACKGROUND OF THE INVENTION

In many communication systems, including both wired and wireless transmission systems, there are strict limitations on transmit signal bandwidth. Such limitations impose a demand for signal modulation with a number of levels greater than two. Many conventional systems employ Trellis-coded modulation (TCM) in such applications.

There is a growing demand for communication systems, including both wired and emerging wireless transmission systems, that require modulation to be accomplished with a number of levels greater than two, mainly due to strict limitations on transmit signal bandwidth. Trellis-coded modulation (TCM) is an example of a conventional modulation scheme for such applications. However, a problem associated with TCM is that it is unsuitable for iterative decoding. Therefore, further improvements in signal quality at an acceptable complexity are difficult to achieve.

"A turbo TCM scheme with low decoding complexity," Catena Networks Inc., Temporary Document BI-090, ITU-T Study Group 15, Question 4, Goa, India, 23–27 Oct. 2000, "Proposal of decision making for turbo coding and report of performance evaluation of proposed TTCM(PCCC) with R-S code and without R-S code," Mitsubishi Electric Corp., Temporary Document BI-003, ITU-T Study Group 15, Goa, India, 23–27 Oct. 2000, and "Results of the requirements requested in the coding ad hoc report," Vocal Technologies Inc., Temporary Document HC-073, ITU-T Study Group 15, Question 4, Huntsville, Canada, 31 Jul.–4 Aug. 2000, describe turbo-coding schemes for multilevel ADSL and VDSL transmission. These turbo-coding techniques involve encoding of the information bits by parallel concatenation of convolutional encoders in recursive systematic form and iterative decoding by one of several possible turbo-decoding techniques. "Block product turbo codes for G.dmt.bis and G.lite.bis." Globespan Inc., Temporary Document BA-063, ITU-T Study Group 15, Question 4, Antwerp, Belgium, 19–23 Jun. 2000 describes the application of block product codes using component Bose-Chaudhuri-Hoequenghem (BCH) codes and their soft iterative decoding based on the Chase algorithm. These techniques offer some performance enhancements over Trellis coding at the expense of incurring additional complexity.

Another coding technique uses Low Density Parity Check (LDPC) block codes. As indicated in R. G. Gallager, "Low-density parity-check codes," *IRE Trans. Info. Theory*, vol. IT-8, pp. 21–28. January 1962, D. J. C. MacKay and R. M. Neal, "Near Shannon limit performance of low density parity check codes, *Electron. Lett.* vol. 32, no. 18, pp. 1645–1646, August 1996, D. J. C. MacKay, "Good error-correcting codes based on very sparse matrices." *IEEE Trans. on Inform. Theory*, vol. 45, No. 2, pp. 399–431, March 1999, and FOSSORIER, M. P. C., MIHALJEVIC, M., and IMAI, H.: "Reduced complexity iterative decoding of low density parity check codes based on belief propagation", IEEE Trans. Commun., 1999, 47, (5), pp. 673–680, coded modulation using LDPC codes has to date focussed on applications requiring binary modulation such as wireless systems or digital magnetic recording.

K. R. Narayanan and J. Li, "Bandwidth efficient low density parity check coding using multilevel coding and iterative multistage decoding," Proc. Int. Symp. on Turbo-Codes, Brest, France, pp. 165–168, September 2000 describes a multilevel coding technique based on binary LDPC block codes. This technique uses LDPC codes for bit-interleaved modulation or for multilevel coding with iterative multi-stage decoding. For bit-interleaved LDPC modulation according to this technique, all the bits used to select a multilevel symbol are LDPC code bits. For multilevel coding, several LDPC codes are used as component codes in a multilevel scheme. This technique has the drawback of requiring more than one LDPC encoder/decoder, leading to substantial implementation complexity especially for long codes and/or large constellation sizes.

"Low density parity check coded modulation for ADSL," Aware Inc., Temporary Document BI-081, ITU-T Study Group 15, Question 4, Goa, India, 23–27 Oct. 2000 also describes a multilevel coding technique based on binary LDPC block codes. This technique is similar to TCM, except that LDPC coding is employed instead of convolutional coding. In particular, set partitioning follows the same principle as that used in TCM. This technique has the drawback of requiring an additional Bose-Chaudhuri-Hoeguenghem (BCH) code which adds to system complexity. Also, set partitioning, as required in TCM and similar schemes, leads to poor performance for soft-decision based decoding techniques.

LDPC codes can be decoded via the sum-product algorithm (SPA). The SPA is described in the aforementioned reference D. J. C. MacKay, "Good error-correcting codes based on very sparse matrices," *IEEE Trans. on Inform. Theory*, vol. 45, No. 2, pp. 399–431, March 1999. The SPA operates on a bipartite graph associated with a given sparse parity check matrix H having M rows and N columns. This graph has two types of nodes: N symbol nodes corresponding to each bit in a code word $\underline{x}$, and M check nodes corresponding to the parity checks $pc_m(\underline{x})$, $1 \leq m \leq M$ represented by the rows of the matrix H. Each symbol node is connected to the check nodes it participates in, and each check node is connected to the symbol nodes it checks. The SPA operates by passing messages between symbol nodes and check nodes. The messages themselves can be a posteroiri probabilities (APP) or log likelihood ratios (LLRs). Typical message parsing schedules alternately compute updates of all symbol nodes and of all check nodes.

The computational complexity of the SPA is governed by the check node updates. In the probability domain, such computation involves the summation of product terms each involving a plurality of probabilities. In the log domain, the check node updates require computation of the inverse hyperbolic tangent of a product of hyperbolic tangent functions of LLRs. Mackay demonstrated via computational simulations that there is a loss in performance of approximately 0.2 dB associated with such conventional techniques. This performance loss can be substantial in terms of block and symbol error rates because of the steepness of the error curves of LDPC codes. A decoding algorithm having a substantially reduced complexity but without incurring a loss in performance would be clearly desirable.

SUMMARY OF THE INVENTION

In accordance with the present invention, there is now provided a method for decoding Low Density Parity Check (LDPC) codes, the method comprising: executing a sum product algorithm to recover a set of information bits from an LDPC code represented as a bipartite graph of symbol nodes and check nodes, the sum product algorithm being responsive to input log likelihood ratios associated with the symbol nodes; characterized in that the method comprises: updating the check nodes of the sum product algorithm; the updating of the check nodes comprising generating a set of forward difference metrics and a set of backward difference metrics in dependence on the ratios of logarithmic probabilities each associated with a corresponding symbol node of the LDPC code, updating each metric in the set of forward difference metrics in dependence on the absolute value of the log likelihood ratio associated with the symbol node and the absolute value of the previous metric in the set, updating each metric in the set of backward difference metrics in dependence on the absolute value of the log likelihood ratio associated with the symbol node and the absolute value of the previous metric in the set, and generating log likelihood ratios to be propagated back to each symbol node in dependence on the updated sets of forward and backward difference metrics.

The updating of the sets of forward and backward metrics preferably further comprises adding a correction factor to each updated difference metrics.

The present invention also extends to apparatus for decoding Low Density Parity Check (LDPC) codes comprising recovery logic for performing the steps of a method herein before described. The present invention further extends to a data storage system comprising a data storage medium, a transducer for converting physical variations in the data storage medium into electrical signals, and apparatus for decoding Low Density Parity Check (LDPC) codes as herein before described for recovering recorded data from the electrical signals generated by the transducer.

Furthermore, the present invention extends to a communications device comprising an information source for generating a set of information bits and apparatus for decoding Low Density Parity Check (LDPC) codes as herein before described for recovering information bits from the received symbols.

BRIEF DESCRIPTION OF THE DRAWINGS

Preferred embodiments of the present invention will now be described, by way of example only, with reference to the accompanying drawings, in which.

DETAILED DESCRIPTION OF THE PREFERRED EMBODIMENT

Figure 1:
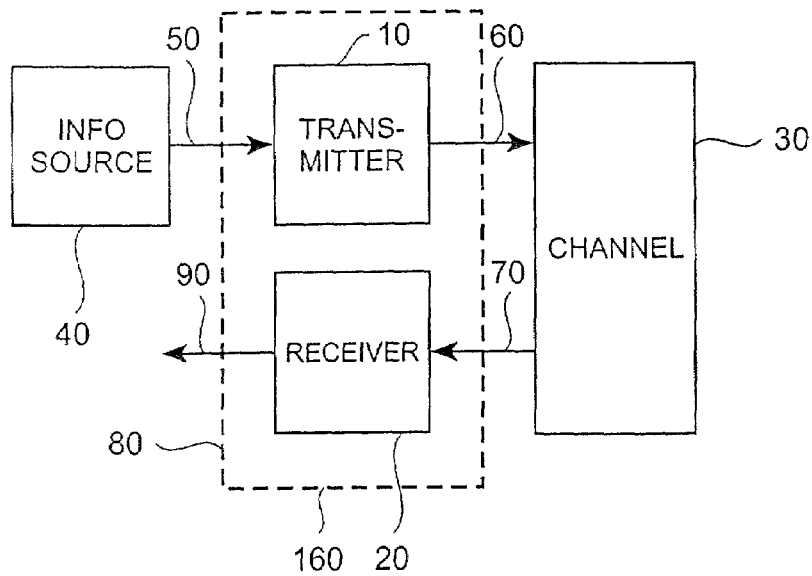
FIG. 1 is a block diagram of a communication system.

Referring first to FIG. 1, a preferred embodiment of the present invention comprises a transmitter 10 connected to a receiver 20 via a communication channel 30. In operation, the transmitter 10 receives a sequence of information bits 50 from an information source 40. The transmitter converts the information bits 50 into multilevel symbols 60 for transmission to the receiver via the communication channel 30. The multilevel symbols 60 are of a complex form having a real part and an imaginary part. The communication channel 30 introduces noise to the multilevel symbols 100 to produce a flow of noisy multilevel symbols 70 into the receiver 20. The receiver then serially recovers the information bits from the received symbols 70. The recovered information bits 80 are then supplied to a recipient system (not shown).

Figure 2:
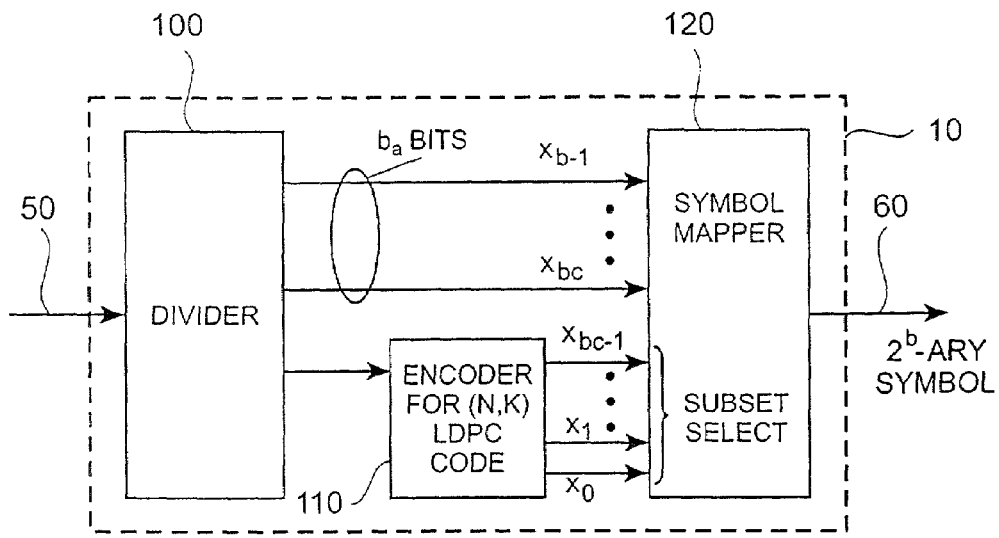
FIG. 2 is a block diagram of a transmitter of the communication system.

Referring now to FIG. 2, the transmitter 10 comprises a divider 100, a block encoder 110 and a symbol mapper 120. In operation, at each modulation instant, the divider 100 divides a set of information 50 bits from the information source 40 to be communicated to the receiver 20 into a first group and a second group. The block encoder 110 encodes the first group to generate a block code. The symbol mapper 120 connected to the divider and the block encoder for selecting a subset of symbols in a constellation of symbols in dependence on the block code according to a Gray-coded mapping function and for selecting a symbol within the subset in dependence on the second group according to a Gray-coded mapping function. Multilevel symbols 60 thus generated by the symbol mapper 120 are communicated to the receiver 20 via the communication channel 30. The divider 100 may implemented by a shift register or similar logical function.

Figure 3:
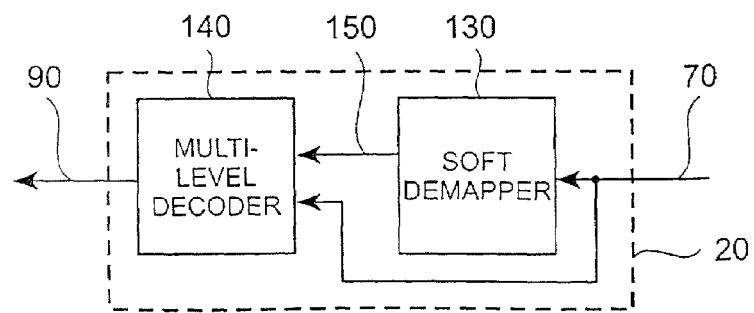
FIG. 3 is a block diagram of a receiver of the communication system.

With reference to FIG. 3, the receiver 20 comprises a multilevel decoder 140 and a soft demapper 130. In operation, the noisy multilevel symbols 70 are soft demapping by the soft demapper 130 to provide soft information on individual code bits in the form of a posteriori probabilities 150. The probabilities 150 are employed at the multilevel decoder 140 to carry out an LDPC decoding procedure comprising a Sum-Product Algorithm (SPA) for recovering the information bits from the received symbols 70. The recovered information bits 90 are then supplied to a recipient system.

Referring back to FIG. 1, it will be appreciated that the transmitter 10 and receiver 20 may be implemented by hardwired logic, by a general purpose processor or dedicated digital signal processor programmed with computer program code, or by hardwired logic and computer program code in combination. In will also be appreciated that the functions of transmitter 10 and receiver 20 may be integrated in a unitary device 160 such as an application specific integrated circuit (ASIC) transceiver device.

When the symbol constellation employed in the symbol mapper 120 is a square QAM constellation (i.e., b is even), and provided that the in-phase and quadrature components of the noise at the input of the soft demapper 130 are independent, soft demapping can be achieved independently for the real and imaginary parts of the complex symbols received. The computational complexity of soft demapping is substantially reduced in comparison with joint demapping of real and imaginary signals jointly. Square QAM constellations will therefore be considered for the purposes of this explanation. However, extensions to cover other types and shapes of constellations can easily be derived. It will thus suffice to describe multilevel LDPC encoding and decoding for L-ary PAM ($L=2^b$) with the symbol alphabet $$\overset{\circ}{A} = \{A_0 = -(L-1), \ A_1 = -(L-3), \ \ldots, \ A_{L/2-1} = -1, \\ A_{L/2} = +1, \ \ldots, \ A_{L-1} = +(L-1)\}. \tag{1}$$

Each symbol in the set $\overset{\circ}{A}$ is labeled with a binary b-tuple $(x_{b-1}, x_{b-2}, \ldots, x_1, x_0)$. The $b_c$ least significant bits (LSBs) $(x_{b_c-1}, x_{b_c-2}, \ldots, x_1, x_0)$ label subsets of the set $\overset{\circ}{A}$. The subsets $\overset{\circ}{A}_i$, $i=0, 1, \ldots, 2^{b_c}-1$ are obtained by partitioning $\overset{\circ}{A}$ so as to maximize the minimum Euclidean distance between the symbols within each subset. The $b_u = b - b_c$ most significant bits (MSBs) $(x_{b-1}, x_{b-2}, \ldots, x_{b-b_u+1}, x_{b-b_u})$ label the symbols within a subset. Furthermore, the $b_c$ LSBs and $b_u$ MSBs each follow a Gray coding rule. Table 1 below gives an example of symbol labeling and mapping for the case L=16. Note that the symbol mapping obtained by this approach is different from the one used in conventional trellis-coded modulation. A description of conventional trellis-coded modulation is provided in G. Ungerboeck, "Channel coding with multilevel/phase signals," IEEE Trans. on Information Theory, Vol. IT-28, No. 1, pp. 55–67, January 1982.

TABLE 1

Example of symbol labeling for the case L = 16, with $b_u$ = 2 and $b_c$ = 2.

| L-ary symbol | $x_3$ | $x_2$ | $x_1$ | $x_0$ | Subset number |
|---|---|---|---|---|---|
| +15 | 0 | 0 | 0 | 0 | 0 |
| +13 | 0 | 0 | 0 | 1 | 1 |
| +11 | 0 | 0 | 1 | 1 | 2 |
| +9 | 0 | 0 | 1 | 0 | 3 |
| +7 | 0 | 1 | 0 | 0 | 0 |
| +5 | 0 | 1 | 0 | 1 | 1 |
| +3 | 0 | 1 | 1 | 1 | 2 |
| +1 | 0 | 1 | 1 | 0 | 3 |
| −1 | 1 | 1 | 0 | 0 | 0 |
| −3 | 1 | 1 | 0 | 1 | 1 |
| −5 | 1 | 1 | 1 | 1 | 2 |
| −7 | 1 | 1 | 1 | 0 | 3 |
| −9 | 1 | 0 | 0 | 0 | 0 |
| −11 | 1 | 0 | 0 | 1 | 1 |
| −13 | 1 | 0 | 1 | 1 | 2 |
| −15 | 1 | 0 | 1 | 0 | 3 |

With the above labeling, an L-ary symbol is used to convey $b_c$ LDPC code bits and $b_u$ uncoded information bits. If coding is achieved with a binary (N, K) LDPC code with K being the information block length and N being the code length, then this mapping technique results in a spectral efficiency of $$\eta = \frac{K}{N} b_c + b_u \, bits/s/Hz \tag{2}$$

Decoding of the LDPC-coded signals is achieved in two steps: in the first step, LDPC decoding is performed for the sequence of least significant $b_c$ bits and in the second step the sequence of $b_u$ uncoded bits is estimated.

Denoting by y the received real signal (corresponding, in general, to the real or imaginary part of the received complex signal):

$$y = A + n \tag{3}$$

With $A \in \overset{\circ}{A}$ and n an AWGN sample with variance $\sigma_n^2$, the a posteriori probability (APP) that bit $x_\lambda$, $\lambda = 0, 1 \ldots, b_c - 1$, is zero (alternately one) is computed as:

$$Pr(x_\lambda = 0 \mid y) = \frac{\sum_j e^{-\frac{(y - A_j)^2}{2\sigma_n^2}}}{\sum_j^{L-1} e^{-\frac{(y - A_j)^2}{2\sigma_n^2}}}, \tag{4}$$

Where the summation in the numerator is taken over all symbols $A_j \in \overset{\circ}{A}$ for which $x_\lambda = 0$. Iterative LDPC decoding is achieved by the sum-product algorithm (SPA) using the above APPs.

In the second decoding step, the $b_u$ MSBs are estimated for each received signal by first determining a subset $\overset{\circ}{A}_i$ based on the recovered LDPC code bits and then making a minimum Euclidean distance symbol-decision within this subset. This second decoding step therefore involves a relatively low implementation complexity.

To illustrate the performance that can be achieved with the multilevel modulation technique herein before described transmission is considered over an AWGN channel using 64-QAM and 4096-QAM. The results are presented in terms of symbol-error rate versus the normalized signal-to-noise ratio ($SNR_{norm}$) defined as $$SNR_{norm} = \frac{\eta}{2^\eta - 1} \frac{E_b}{N_o} \tag{5}$$

where $E_b/N_0$ is the ratio of energy-per-bit to noise-power-spectral-density. The (1998, 1777) code used in the simulations is due to MacKay.

Figure 4:
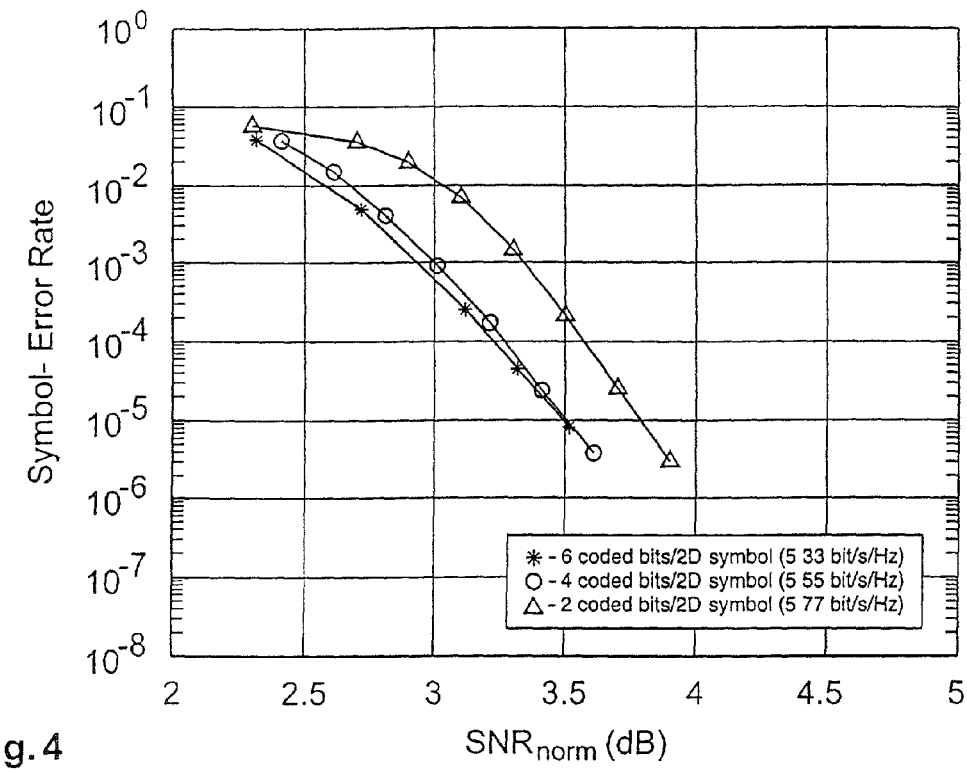
FIG. 4 is a graph of symbol-error probability versus $SNR_{norm}$ for a 64-QAM communication system.

The graph of FIG. 4 is based on 64-QAM (b=3 along each dimension) and shows performance for the cases where $b_u=0$ (no uncoded bits), $b_u=1$ (2 uncoded bits per 2D symbol), and $b_u=2$ (4 uncoded bits per 2D symbol).

Figure 5:
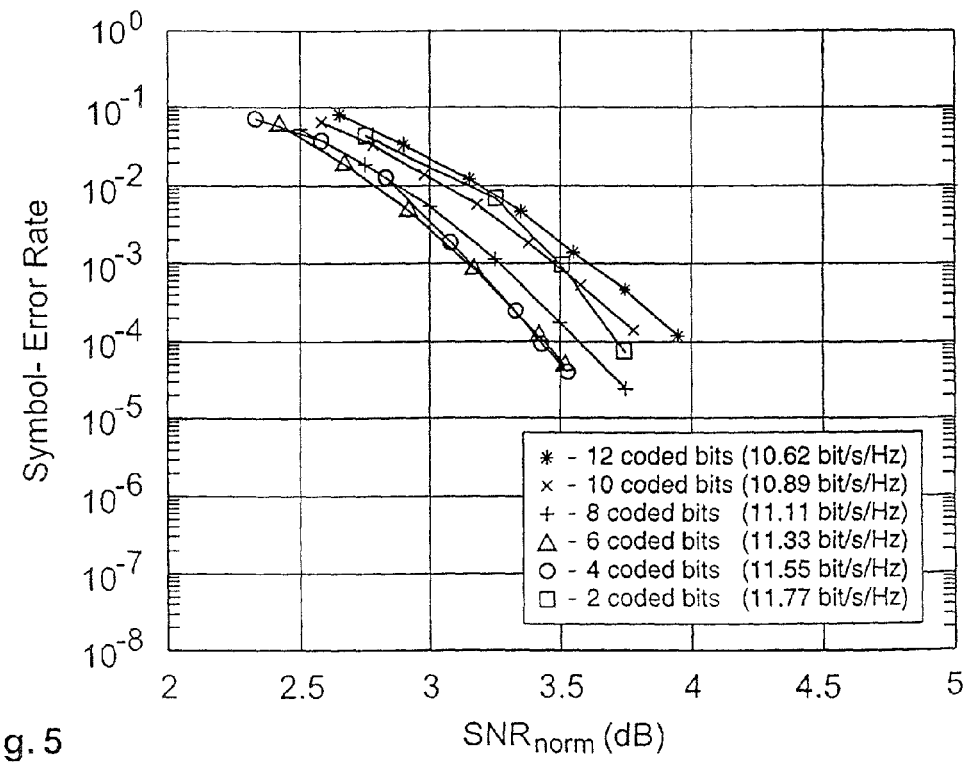
FIG. 5 is a graph of symbol-error probability versus $SNR_{norm}$ for a 4096-QAM communication system.

FIG. 5 shows the effect of introducing uncoded bits for 4096-QAM (b=12 along each dimension) by plotting system performance with 0, 2, 4, 6, 8, and 10 uncoded bits per 2D symbol ($b_u=0, 1, 2, 3, 4$, and 5, respectively).

FIGS. 4 and 5 demonstrate that it is generally sufficient to encode two LSBs only to achieve acceptable performance.

Decoder complexity can be reduced in various ways. For example, not all the L terms need to be included in the sum appearing in the denominator of equation (4): if for a received signal y the closest L'<L nominal levels are determined the summation can be modified to include these L' levels only. The resulting loss in performance is usually very small. A similar approach can be taken for the numerator term. Furthermore, messages passed between the nodes in the SPA need not be a posteriori probabilities but can be likelihood or log-likelihood ratios. Various simplifications of the SPA can be adopted for different implementations depending on specific applications.

The multilevel techniques herein before described are suitable for use in multicarrier modulation systems. Examples of such systems include discrete multitone modulation systems and filtered multitone modulation systems such as ADSL, ADSL lite and VDSL systems. In multicarrier modulation, as each carrier adapts the spectral efficiency of its transmission to the channel characteristics, the employed multilevel symbol constellation can vary from one carrier to the next. Coding is not performed separately for each sub channel but rather "across" sub channels. Therefore, the provision of uncoded bits allows multilevel coding to be achieved in a very flexible way because different constellation sizes can be accommodated efficiently.

As mentioned earlier, LDPC codes can be decoded at the receiver 20 via the sum-product algorithm (SPA). The SPA is described in the aforementioned reference D. J. C. MacKay, "Good error-correcting codes based on very sparse matrices." *IEEE Trans. on Inform. Theory*, vol. 45, No. 2. pp. 399–431, March 1999. The SPA operates on a bipartite graph associated with a given sparse parity check matrix H having M rows and N columns. This graph has two types of nodes: N symbol nodes corresponding to each bit in a code word $\underline{x}$, and M check nodes corresponding to the parity checks $pc_m(\underline{x})$, $1 \leq m \leq M$, represented by the rows of the matrix H. Each symbol node is connected to the check nodes it participates in, and each check node is connected to the symbol nodes it checks. The SPA operates by passing messages between symbol nodes and check nodes. The messages themselves can be a posteriori probabilities (APP) or log likelihood ratios (LLRs). Typical message parsing schedules alternately compute updates of all symbol nodes and of all check nodes.

The computational complexity of the SPA is governed by the check node updates. In the probability domain, such computation involves the summation of the product terms each involving a plurality of probabilities. In the log domain, the check node updates require computation of the inverse hyperbolic tangent of a product of hyperbolic tangent functions of LLRs. Mackay demonstrated via computational simulations that there is a loss in performance of approximately 0.2 dB associated with such conventional techniques. This performance loss can be substantial in terms of block and symbol error rates because of the steepness of the error curves of LDPC codes. An SPA having a substantially reduced complexity but without incurring a loss in performance would be clearly desirable.

In a preferred embodiment of the present invention, an approximate check node update is based on a difference-metric approach on a two state trellis. This approach employs a dual max. approximation. The aforementioned Fossorier reference describes an example of a dual max. approximation. The approach can be thought of as similar to a Viterbi algorithm on a two state parity check trellis. The approach uses the difference of state metrics, i.e., the difference of logs, which is the LLR of the probabilities. The approach is recursive and requires one sign bit manipulation and one comparison at a time. This greatly simplifies computational implementation and facilitates parallel recursive operation in a general purpose Digital Signal Processor (DSP) environment, or in an application specific integrated circuit (ASIC) or similar custom logic design.

In a particularly preferred embodiment of the present invention, the performance of the algorithm is improved by introduction of a correction factor. The correction factor involves the addition of a constant at every recursive step. The added constant can be viewed as a fixed offset with the appropriate polarity. The addition does not significantly increase computational complexity. It is found that the correction factor brings the performance of the algorithm to within 0.05 dB of the performance of the full SPA.

In a preferred embodiment of the present invention to be described shortly, there is provided a soft input/output detection method for decoding LDPC codes by exchanging reliability information between the soft demapper 130 and the multilevel decoder 140 in an iterative fashion. This decoding method advantageously delivers similar performance to that of full SPA, but with considerably reduced complexity. The encoded data is demapped into soft bits prior to LDPC decoding. LDPC codes can be decoded in an iterative fashion via a complex soft input/output algorithm in a manner which is computationally simpler than that conventionally employed for decoding turbo codes. Also, as mentioned earlier, LDPC codes exhibit asymptotically an excellent performance without "error floors". Further, LDPC codes offer a range of tradeoffs between performance and decoding complexity.

Following the notation employed in the aforementioned Mackay and Fossosier references, let $N(m)=\{n:H_{m,n}=1\}$ be the set of bits that participate in check m, and let $M(n)=\{m: H_{m,n}=1\}$ be the set of checks in which bit n participates. The exclusion of an element n from $N(m)$ or m from $M(n)$ is denoted by $N(m)\backslash n$ or $M(n)\backslash m$, respectively, and $H^T$ is the transpose of H. Finally, let $\underline{y}=[y_1, \ldots, y_N]$ be the received sequence that corresponds to the transmitted codeword $\underline{x}=[x_1, \ldots, x_N]$. The inputs of the SPA consist of LLRs $\ln(P(x_n=1|y_n)/P(x_n=0|y_n))$ or, equivalently, of APPs $P(x_n=1|y_n)$ and $P(x_n=0|y_n)$, which are determined by the channel statistics. Operation of the SPA then proceeds in the following steps:

Initialization: $q_{m,n}(x) = P(x_n=x|y_n)$ for $x=0, 1$.

Step 1 (check-node update): For each m and $n \in N(m)$, and for $x=0, 1$, compute $$r_{m,n}(x) = \sum_{\{x_{n'} : n' \in N(m)\backslash n\}} P(pc_m(\underline{x}) = 0 | x_n = x,$$

$$\{x_{n'} : n' \in N(m)/n\}) \prod_{n' \in N(m)\backslash n} q_{m,n'}(x_{n'}),$$

where the conditional probability in the summation is an indicator function that indicates whether the m-th check-sum is satisfied given the hypothesized values for $x_n$ and $\{x_{n'}\}$.

Step 2 (symbol-node update): For each n, and $m \in M(n)$, and for $x=0, 1$, update $$q_{m,n}(x) = \mu_{m,n} P(x_n = x | y_n) \prod_{m' \in M(n)\backslash m} r_{m',n}(x),$$

where the constant $\mu_{m,n}$ is chosen such that $q_{m,n}(0)+q_{m,n}(1)=1$.

For each n and for $x=0, 1$, update the "pseudoposterior probabilities" $q_n(.)$ as $$q_n(x) = \mu_n P(x_n = x | y_n) \prod_{m \in M(n)} r_{m,n}(x), \quad (6)$$

where the constant $\mu_n$ is chosen such that $q_n(0)+q_n(1)=1$.

Step 3: (a) Quantize $\hat{\underline{x}}=[\hat{x}_1, \ldots, \hat{x}_N]$ such that $\hat{x}_n=1$ if $q_n(1)>0.5$, and
$\hat{x}_n=0$ if $q_n(1) \leq 0.5$.

(b) If $\hat{\underline{x}} H^T = 0$, then stop and $\hat{\underline{x}}$ is the decoder output; otherwise go to Step 1.

(c) Declare a failure if the algorithm does not halt within some maximum number of iterations.

In a preferred embodiment of the present invention, LLRs are employed as messages in place of APPs. This permits replacement of the multiplications in Step 2 of the SPA with additions. Step 3 can also be easily adapted for LLRs. Advantageously, LLRs can also be efficiently used in Step 1 without converting between LLRs and APPs.

Simplified Sum-Product Step Using Log-Likelihood Ratios:

In general, each check-sum $pc_m(\underline{x})$ can be viewed as a single-parity check code on the $k=|N(m)|$ symbols it checks. The node messages $r_{m,n}(x)$ of Step 1 can be regarded as extrinsic information for $x_n$ given the statistics $q_{m,n}(.)$. These messages can be computed by the forward-backward algorithm proposed by Mackay on the two-state trellis of the single-parity check code as follows (where $\oplus$ denotes addition modulo 2):

initialization of state metrics: $\alpha_0(0)=1$, $\alpha_0(1)=0$; $\beta_k(0)=1$, $\beta_k(1)=0$;

forward recursion: For $i=1, \ldots, k-1$ and $x=0, 1$ $$\alpha_i(x)=\alpha_{i-1}(0)q_{m,i}(x)+\alpha_{i-1}(1)q_{m,i}(x\oplus 1); \quad (7)$$

backward recursion: For $i=(k-1), \ldots, 1$ and $x=0, 1$ $$\beta_i(0)=\beta_{i+1}(0)q_{m,i+1}(x)+\beta_{i+1}(1)q_{m,i+1}(x\oplus 1);$$

combining recursion: For $i=1, \ldots, k$ and $x=0, 1$ $$r_{m,i}(x)=\alpha_{i-1}(0)\beta_i(x)+\alpha_{i-1}(1)\beta_i(x\oplus 1).$$

In the LLR domain, let $$\delta A_i \triangleq \ln \frac{\alpha_i(1)}{\alpha_i(0)} \text{ and } \delta B_i \triangleq \ln \frac{\beta_i(1)}{\beta_i(0)}.$$

Note that the LLRs $\delta A_i$ and $\delta B_i$ can be viewed as the forward and backward difference metrics in the log domain. The application of a difference-metric approach to the dual-max detector for partial-response class IV channels is described in ÖLCER, S., and UNGERBOECK, G.: 'Reed-Muller coding for partial response channels'. 1993 IEEE Int. Symp. on Information Theory, San Antonio, Tex. (IEEE, Piscataway, 1992), p. 243. Consider the two-state parity-check trellis using the difference of state metrics, i.e., the difference of logarithms, which is merely the LLR of the probabilities. Consider also the following LLRs:

$$\lambda_{m,i} \triangleq \ln \frac{q_{m,i}(1)}{q_{m,i}(0)} \text{ and } \Lambda_{m,i} \triangleq \ln \frac{r_{m,i}(1)}{r_{m,i}(0)}.$$

Using the above definitions, the standard approximation ln $$\sum_j \exp a_j \approx \max_j a_j$$

and the dual-max rule described in VITERBI, A. J.: 'An intuitive justification and a simplified implementation of the MAP decoder for convolutional codes', IEEE J. Sel. Areas Commun., 1998, 16, (2), pp. 260–264, the forward recursion (7) can be rewritten as $$\delta A_i = \ln \frac{a_{i-1}(0)q_{m,i}(1) + a_{i-1}(1)q_{m,i}(0)}{a_{i-1}(0)q_{m,i}(0) + a_{i-1}(1)q_{m,i}(1)}$$

$$= \ln\{\exp(\lambda_{m,i}) + \exp(\delta A_{i-1})\} - \ln\{1 + \exp(\lambda_{m,i} + \delta A_{i-1})\} \quad (8)$$

-continued $$\approx \max\{\lambda_{m,i}, \delta A_{i-1}\} - \max\{0, \lambda_{m,i} + \delta A_{i-1}\} \quad (9)$$

$$= \begin{cases} -sgn(\delta A_{i-1})\lambda_{m,i} & \text{if } |\delta A_{i-1}| > |\lambda_{m,i}| \\ -sgn(\lambda_{m,i})\delta A_{i-1} & \text{otherwise,} \end{cases}$$

where sgn(.) is the sign function.

The backward and the combining recursions can be reformulated in a similar way, which results in the following LLR version of the forward-backward algorithm:

initialization: $\delta A_0 = \infty$ and $\delta B_k = \infty$ forward recursion: For $i=2 \ldots k-1$ $$\delta A_i = \begin{cases} -sgn(\delta A_{i-1})\lambda_{m,i} & \text{if } |\delta A_{i-1}| > |\lambda_{m,i}| \\ -sgn(\lambda_{m,i})\delta A_{i-1} & \text{otherwise} \end{cases} \quad (10)$$

backward recursion: For $i=k-1 \ldots 1$ $$\delta B_i = \begin{cases} -sgn(\delta B_{i+1})\lambda_{m,i+1} & \text{if } |\delta B_{i+1}| > |\lambda_{m,i+1}| \\ -sgn(\lambda_{m,i+1})\delta B_{i+1} & \text{otherwise} \end{cases} \quad (11)$$

combining recursion For $i=1 \ldots k$ $$\Lambda_i = \begin{cases} -sgn(\delta A_{i-1})\delta B_i & \text{if } |\delta A_{i-1}| > |\delta B_i| \\ -sgn(\delta B_i)\delta A_{i-1} & \text{otherwise} \end{cases} \quad (12)$$

Correction Factor for the Dual-Max Approximation:

The simplified SPA that results from using Equations (10) to (12) for the check node updates will be called the LLR-SPA because it operates entirely in the LLR domain. The LLR-SPA has a slightly lower performance than the full SPA. Following the aforementioned Viterbi reference, together with GROSS, W. J. and GULAK, P. G.: 'Simplified MAP algorithm suitable for implementation of turbo decoders', Electron. Lett., 1998, 34, (16), pp. 1577–1578, a correction factor can be applied to improve the dual-max approximation from Equations (8) and (9). Using the identity $$\ln\{\exp(x)+\exp(y)\}-\max\{x, y\}=\ln\{1+\exp(-|x-y|)\},$$

it can be shown that the approximation error, i.e., (8) minus (9), is given by the bivariate function $$f(u, v) = \ln \frac{1 + \exp(-|u - v|)}{1 + \exp(-|u + v|)},$$

where $u=\delta A_{i-1}$ and $v=\lambda_{m,i}$. In practice, f(u, v) can be approximated by using a single correction factor c, i.e., $$f(u, v) \approx \begin{cases} c & \text{if } |u + v| > 2|u - v| \text{ and } |u - v| < 2 \\ -c & \text{if } |u - v| > 2|u + v| \text{ and } |u + v| < 2 \\ 0 & \text{otherwise.} \end{cases}$$

Figure 6:
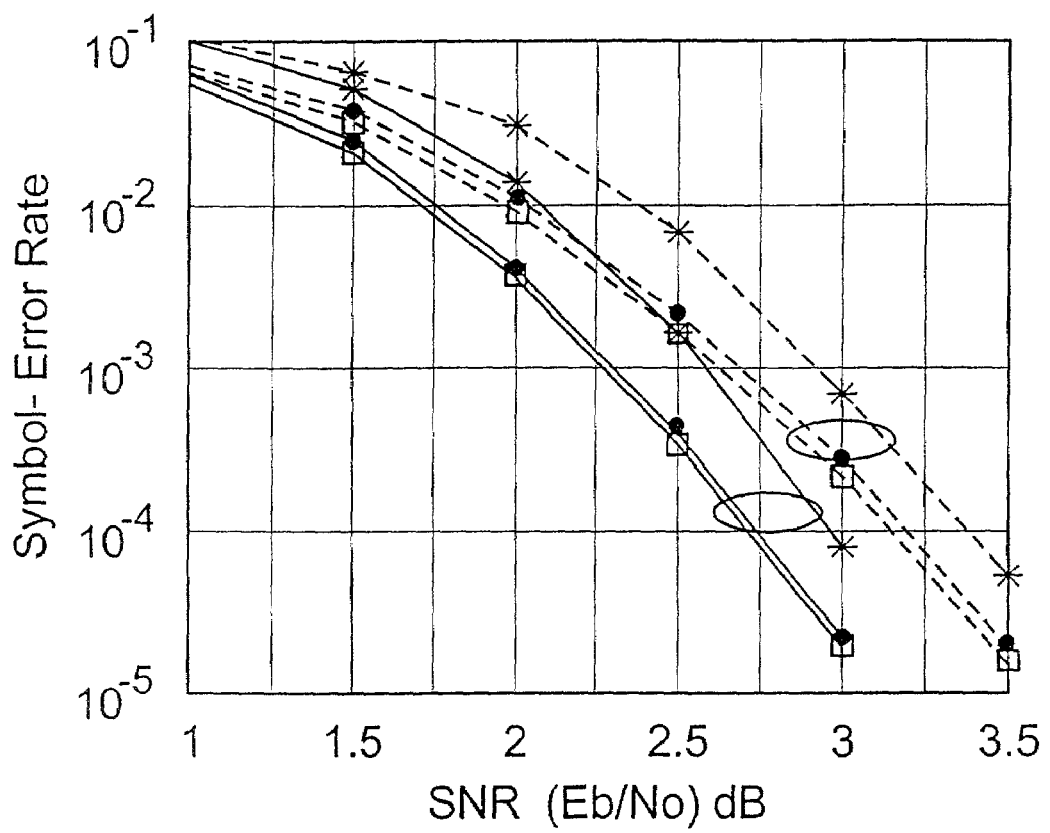
FIG. 6 is a graph demonstrating the performance of an example of an LLR-SPA for an additive white Gaussian noise channel.

A similar correction factor applies to the approximations in the backward and combining recursions. The constant c can be selected to maximize the performance gains in the region of interest with respect to bit-error rate or signal-to-noise ratio. FIG. 6 shows the performance of the LLR-SPA with correction factor c=0.5 for an additive white Gaussian noise channel using the same rate-½ LDPC code with N=504 as in the aforementioned Fossorier reference. For comparison, the performance of the full SPA and LLR-SPA is also shown. The number of iterations for the two sets of curves shown is at most 10 and 200, respectively. It can be seen that LLR-SPA with correction factor performs within less than 0.05 dB of the full SPA.

The present invention is applicable to decoding of LDPC codes in data storage applications. In particular, LDPC codes may be employed in parallel with, or as replacements for, conventional Reed-Solomon error correction codes in magnetic and optical recording applications. Inter-symbol interference is well-known in magnetic recording channels. A magnetic recording channel and encoder in combination can be represented by finite state machine in the form of a serially concatenated system. In a preferred embodiment of the present invention to be described shortly, there is provided a soft input/output detection method for decoding LDPC codes in a data storage system by exchanging reliability information in an iterative fashion. This decoding method and decoding scheme advantageously delivers similar performance to that of full SPA, but with considerably reduced complexity.

Figure 7:
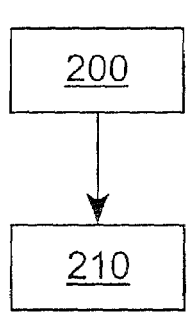
FIG. 7 is a flow diagram of a method for decoding LDPC codes.

With reference now to FIG. 7, in a preferred embodiment of the present invention, a method for decoding Low Density Parity Check (LDPC) codes comprises, at step 200, executing a sum product algorithm to recover a set of information bits from an LDPC code represented as a bipartite graph of symbol nodes and check nodes, the sum product algorithm being responsive to input log likelihood ratios associated with the symbol nodes. The method also comprises, at step 210, updating the check nodes of the sum product algorithm.

Figure 8:
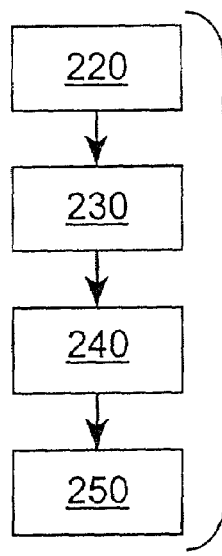
FIG. 8 is a flow diagram of an example of an updating step of the method shown in FIG. 7.

Referring to FIG. 8, the updating step of the check nodes comprises, at step 220, generating a set of forward difference metrics and a set of backward difference metrics in dependence on the ratios of logarithmic probabilities each associated with a corresponding symbol node of the LDPC code. At step 230, each metric in the set of forward difference metrics is updated in dependence on the absolute value of the log likelihood ratio associated with the symbol node and the absolute value of the previous metric in the set. At step 240, each metric in the set of backward difference metrics is updated in dependence on the absolute value of the log likelihood ratio associated with the symbol node and the absolute value of the previous metric in the set. At step 250, log likelihood ratios to be propagated back to each symbol node are generated in dependence on the updated sets of forward and backward difference metrics.

Figure 9:
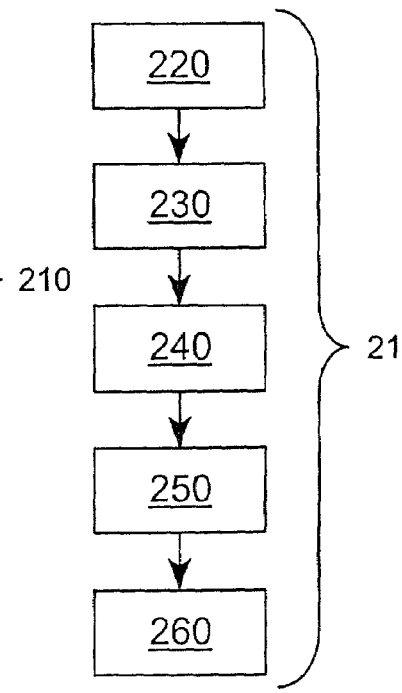
FIG. 9 is a flow diagram of another example of an updating step of the method shown in FIG. 7.

Referring to FIG. 9, a modification to the preferred embodiment of the present invention herein before described with reference to FIG. 8 further comprises, at step 260, adding a correction factor to each updated difference metrics.

Figure 10:
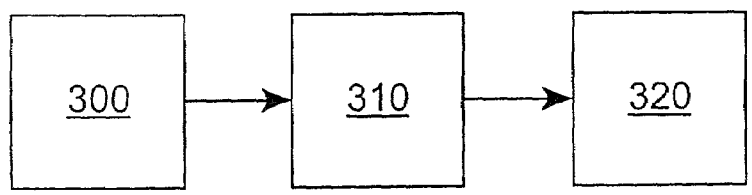
FIG. 10 is a block diagram of a data storage system.

Referring now to FIG. 10, an example a data storage system embodying the present invention comprises a data storage medium 300, a transducer 310, and data recovery apparatus 320 connected to the output of the transducer 310. In operation, the transducer 310 converts physical variations in the data storage medium 300 into electrical signals. The data recovery apparatus 320 executes the method herein before described with reference to FIGS. 7 and 8 to recovereres recorded data from the electrical signals generated by the transducer 310. It will be appreciated that the data recovery apparatus 320 may implemented by hardwired logic, by computer program code executing on a processor, or by a combination thereof.

Figure 11:
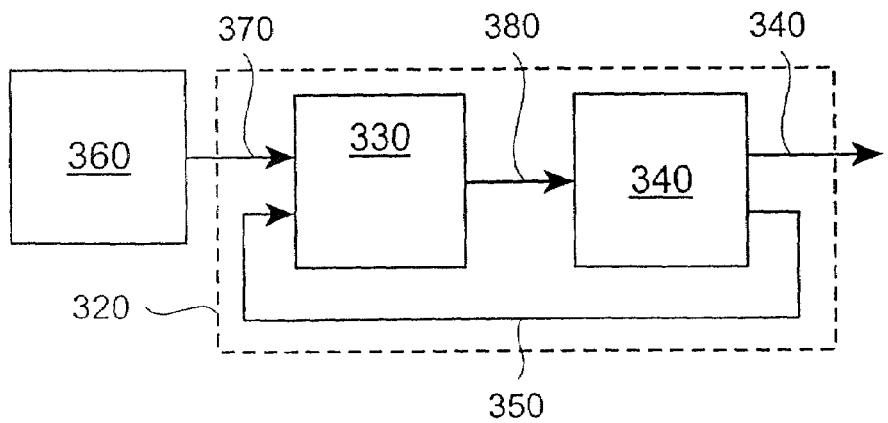
FIG. 11 is a block diagram of a data recovery apparatus of the data storage system.

Referring now to FIG. 11, the data recovery apparatus 320 comprises a soft in/soft out decoder 330 connected to an LDPC decoder 340. The transducer 310 and the storage medium 300 can be notionally lumped together into an equivalent channel 360. In operation, symbols 370 from the equivalent channel 360 are translated into soft bits 380 by the soft decoder 330. Bit decisions 390 are generated by the LDPC decoder 340 based on the soft bits 380. The LDPC decoder also generates log likelihood ratios (LLRs) 350. The LLRs 350 are fed back into the soft decoder 330.

In summary, what has been herein before described by way of example of the present invention is a reduced complexity algorithm for Low Density Parity Check. The algorithm operates entirely in the Log-Likelihood domain. Check node updates of a sum product algorithm are simplified by using a difference metric approach on a two state trellis and by employing a dual max. approximation.

What is claimed is:

1. A method for decoding Low Density Parity Check (LDPC) codes in a receiver for recovering information from received signals, the method comprising:

executing in a decoder of said receiver a sum product algorithm to recover a set of information bits from an LDPC code represented as a bipartite graph of symbol nodes and check nodes, the sum product algorithm being responsive to input log likelihood ratios associated with the symbol nodes;

generating a set of forward difference metrics and a set of backward difference metrics in dependence on ratios of logarithmic probabilities each associated with a corresponding symbol node of the LDPC code, updating each metric in the set of forward difference metrics in dependence on an absolute value of the log likelihood ratio associated with the symbol node and the absolute value of a previous metric in the set, updating each metric in the set of backward difference metrics in dependence on the absolute value of the log likelihood ratio associated with the symbol node and the absolute value of the previous metric in the set, and generating log likelihood ratios to be propagated back to each symbol node in dependence on the updated sets of forward and backward difference metrics.

2. A method as claimed in claim 1, wherein updating of the sets of forward and backward metrics further comprises adding a correction factor to each updated difference metrics.

3. Apparatus for decoding Low Density Parity Check (LDPC) codes, the apparatus comprising recovery logic for performing the steps of a method as claimed in claim 1.

4. A data storage system, comprising:

a data storage medium;

a transducer for converting physical variations in the data storage medium into electrical signals; and an apparatus for decoding Low Density Parity Check (LDPC) codes for recovering recorded data from the electrical signals generated by the transducer, the apparatus for decoding Low Density Parity Check (LDPC) codes further comprising:

logic that executes a sum product algorithm to recover a set of information bits from an LDPC code represented as a bipartite graph of symbol nodes and check nodes, the sum product algorithm being responsive to input log likelihood ratios associated with the symbol nodes;

logic that generates a set of forward difference metrics and a set of backward difference metrics in dependence on ratios of logarithmic probabilities each associated with a corresponding symbol node of the LDPC code, logic that updates each metric in the set of forward difference metrics in dependence on an absolute value of the log likelihood ratio associated with the symbol node and an absolute value of a previous metric in the set, logic that updates each metric in the set of backward difference metrics in dependence on the absolute value of the log likelihood ratio associated with the symbol node and the absolute value of the previous metric in the set, and logic that generates log likelihood ratios to be propagated back to each symbol node in dependence on the updated sets of forward and backward difference metrics.

5. A data storage system as recited in claim 4 wherein the updating of the sets of forward and backward metrics further comprises adding a correction factor to each updated difference metric.

6. A communications device, comprising:

an information source for generating a set of information bits; and an apparatus for decoding Low Density Parity Check (LDPC) codes for recovering information bits from the received symbols by performing the steps of:

executing a sum product algorithm to recover a set of information bits from an LDPC code represented as a bipartite graph of symbol nodes and check nodes, the sum product algorithm being responsive to input log likelihood ratios associated with the symbol nodes;

generating a set of forward difference metrics and a set of backward difference metrics in dependence on ratios of logarithmic probabilities each associated with a corresponding symbol node of the LDPC code, updating each metric in the set of forward difference metrics in dependence on an absolute value of the log likelihood ratio associated with the symbol node and the absolute value of a previous metric in the set, updating each metric in the set of backward difference metrics in dependence on the absolute value of the log likelihood ratio associated with the symbol node and the absolute value of the previous metric in the set, and generating log likelihood ratios to be propagated back to each symbol node in dependence on the updated sets of forward and backward difference metrics.

7. A communication device as recited in claim 6 wherein the updating of the sets of forward and backward metrics further comprises adding a correction factor to each updated difference metric.

8. A computer program embodied on a computer readable medium, comprising:

a code segment that executes a sum product algorithm to recover a set of information bits from an LDPC code represented as a bipartite graph of symbol nodes and check nodes, the sum product algorithm being responsive to input log likelihood ratios associated with the symbol nodes;

a code segment that generates a set of forward difference metrics and a set of backward difference metrics in dependence on ratios of logarithmic probabilities each associated with a corresponding symbol node of the LDPC code, a code segment that updates each metric in the set of forward difference metrics in dependence on an absolute value of the log likelihood ratio associated with the symbol node and the absolute value of a previous metric in the set, a code segment that updates each metric in the set of backward difference metrics in dependence on the absolute value of the log likelihood ratio associated with the symbol node and the absolute value of the previous metric in the set, and a code segment that generates log likelihood ratios to be propagated back to each symbol node in dependence on the updated sets of forward and backward difference metrics.

9. A computer program as recited in claim 8 wherein the code segment that updates the sets of forward and backward metrics adds a correction factor to each updated difference metric.

* * * * *